United States Patent

Ku et al.

[11] Patent Number: 6,141,273
[45] Date of Patent: Oct. 31, 2000

[54] CIRCUIT FOR SETTING WIDTH OF INPUT/OUTPUT DATA IN SEMICONDUCTOR MEMORY DEVICE

[75] Inventors: Kie-bong Ku, Icheon-shi; Tae-yun Kim, Choongchungpook-do, both of Rep. of Korea

[73] Assignee: Hyundai Electronics Industries Co., Ltd., Kyunggi-do, Rep. of Korea

[21] Appl. No.: 09/475,425

[22] Filed: Dec. 30, 1999

[30] Foreign Application Priority Data

Dec. 31, 1998 [KR] Rep. of Korea ............ 98-63704

[51] Int. Cl.$^7$ ............................................. G11C 7/00
[52] U.S. Cl. ............... 365/201; 365/225.7; 365/189.05
[58] Field of Search .................... 365/201, 189.05, 365/225.7

[56] References Cited

U.S. PATENT DOCUMENTS

| | | | |
|---|---|---|---|
| 5,657,293 | 8/1997 | Merritt et al. | 365/233.5 |
| 5,751,629 | 5/1998 | Nova et al. | 365/151 |
| 5,761,145 | 6/1998 | Zagar et al. | 365/226 |
| 5,781,483 | 7/1998 | Shore | 365/200 |
| 5,838,625 | 11/1998 | Cutter et al. | 365/225.7 |
| 5,848,010 | 12/1998 | Sher | 365/201 |
| 5,877,987 | 3/1999 | Merritt | 365/189.05 |
| 5,892,716 | 4/1999 | Ingalls | 365/189.05 |

Primary Examiner—Vu A. Le
Attorney, Agent, or Firm—Crompton, Seager & Tufte, LLC

[57] ABSTRACT

A circuit conveniently sets the width of input/output data in a semiconductor memory device. The circuit includes a test mode signal generator for generating a test mode signal which sets a WCBR mode to a special test mode; a program signal generator for generating a program signal according to the test mode signal output from the test mode signal generator and a signal transmitted through a predetermined address line; a pair of anti-fuse programmers, each having an anti-fuse for outputting a programmed output value indicative of a program status of an anti-fuse programmed according to the program signal; and a decoder for decoding the signal output from the anti-fuse programmers to change the input/output data width of the semiconductor memory device. The anti-fuses are used for resetting the input/output data width at the package level of a manufactured memory device. The decoder generates a first signal for setting an input/output data width at eight bits, if a signal input through the predetermined address line is toggled once, and generates a second signal for setting the input/output data width at four bits, if the signal input through the predetermined address line is toggled once more.

20 Claims, 3 Drawing Sheets

CIRCUIT FOR SETTING WIDTH OF INPUT/OUTPUT DATA IN SEMICONDUCTOR MEMORY DEVICE

BACKGROUND OF THE INVENTION

1. Field of the Invention

The present invention relates to memory devices, and more particularly to a circuit for setting the width of input/output data in a semiconductor memory device, which uses anti-fuses to set the input/output data width at the package level of device manufacture.

2. Discussion of the Related Art

A memory device is a general term for all devices used for temporarily or permanently storing data, commands, and/or programs in a computer, communication system, image-processing system, and the like. Such memory devices can be classified as one of several types: semiconductor, magnetic tape, optical disc and so on, with the semiconductor memory device being the most widely used at present. The semiconductor type of memory device can be further classified according to its electrical characteristics, such as dynamic random access memory (DRAM), static random access memory (SRAM), flash memory, and read only memory (ROM). Among these, DRAM devices take a prominent position in the field.

Meanwhile, since a stored electrical potential may change over time, it is necessary to periodically perform a refresh process to restore the initial status of the stored electrical potential. In other words, since, in a read process of outputting data, a DRAM device detects and amplifies a voltage corresponding to the level of an electrical charge stored in a capacitor, the device is said to have a dynamic characteristic of periodically performing a refresh operation to prevent the destruction of data stored in memory cells.

When a memory device as above is installed into an actual system, the device acts as a main memory unit to store arithmetic results of a central processing unit (CPU). As memory capacity increases, the main memory improves in its data storing function. Accordingly, any increase in the data width for exchanging data with the CPU, as input/output (I/O) data, results in a proportional increase in the access bandwidth and improves data access times.

Due to assembly-related reasons, however, the data width may have to be set before advancing to the package stage of the manufacture of a memory device. To change the data width at the package level, the manufactures of DRAM devices may use one or more of several means: selectively cutting metal or polysilicon fuses provided in the DRAM circuit, forming interconnections using a metallization-layer mask and then etching, or connecting fuses at package level using a wire bonding method. The most common method is the selective cutting method, in which a laser beam is used to cut polysilicon fuses.

FIG. 1 is an I/O data width setting circuit of a conventional memory device. As shown in FIG. 1, the circuit is constructed with first and second fuse selectors 10 and 20 each of which are connected to an external supply voltage (Vext) and ground potential (Vss) and which receive signals transmitted through first ($PAD_1$) and second ($PAD_2$) pads, respectively, and a decoder 30 for decoding signals output from the fuse selectors, to output an internal voltage signal (Vint) and data width setting signals x4, x8, and x16. The first and second fuse selectors 10 and 20 employ polysilicon fuses.

The circuit thus constructed generates data width setting signals x4, x8, and x16 signals according to output signals from the first and second fuse selectors 10 and 20. The generation of these signals are summarized in Table 1, illustrating a variety of data widths to be set according to inputs to the circuit of FIG. 1.

TABLE 1

| $pad_1$ | $pad_2$ | data width |
| --- | --- | --- |
| Vcc (H) | Vcc (H) | sixteen bits (x16) |
| Vcc (H) | Vss (L) | eight bits (x8) |
| Vss (L) | Vcc (H) | not applicable |
| Vss (L) | Vss (L) | four bits (x4) |

In other words, in order to make a change in the I/O data width of a memory device, the polysilicon fuses of the first and second fuse selectors 10 and 20 are selectively cut or wire-bonded to enable the first and second pads to be connected to the input of the decoder 30. Therefore, as the terminals supplying the external supply voltage and its ground potential are detached from the output of the first and second fuse selectors 10 and 20, an alternative voltage signal, in this case, represented by the Vcc and Vss of Table 1, is transmitted through the first and second pads and output to the decoder 30 without the influence of the external supply voltage. According to combination of the alternative voltage signals (Vcc or Vss) transmitted through the first and second pads as shown in Table 1, one of three types of data width setting signals x4, x8, and x16 is generated, to change the I/O data width of the memory device into four bits, eight bits, and sixteen bits, respectively.

Conventionally, the data width is changed with polysilicon fuses, wire bonding, or an etched metallization layer. The implementation of any one of these processes, however, must be carried out before advancement to the package level of the memory device. That is, none of these processes can be applied at the package level or after completion of the manufacture of the memory device.

In addition, the case of a selective cutting of fuses, the laser beam system which is typically used for the cutting step of the process is expensive. Moreover, the necessary pitch used for a plurality of such fuses inevitably increases the layout area of the memory device.

As described above, there has heretofore been no means available for resetting the data width beyond a predetermined stage of memory device manufacture, in particular, the package level of a DRAM device. Thus, the fluctuating demand for memory devices having a particular data width has resulted in shortages as well as excessive inventories. Therefore, a means for setting the I/O data width of a memory device, at the package level or subsequent steps of memory device fabrication, is needed.

SUMMARY OF THE INVENTION

Therefore, it is an object of the present invention to solve the aforementioned problems and provide a circuit for setting the width of I/O data in a semiconductor memory device, which enables changing the I/O data width at the package level and beyond.

It is another object of the present invention to provide a circuit for setting the width of I/O data in a semiconductor memory device, which reduces layout area.

It is still another object of the present invention to provide a circuit for setting the width of I/O data in a semiconductor memory device, which enables a quick response to an immediate condition of consumer demand regarding a memory device's I/O data width.

In order to accomplish the aforementioned objects of the present invention, there is provided a circuit for setting the width of input/output data in a semiconductor memory device. The circuit comprises a test mode signal generator for generating a test mode signal which sets a WCBR mode to a special test mode; a program signal generator for generating a program signal according to the test mode signal output from the test mode signal generator and a signal transmitted through a predetermined address line; a plurality of anti-fuse programmers, each having an anti-fuse for outputting a programmed output value indicative of a program status of an anti-fuse programmed according to the program signal; and a decoder for decoding the signal output from the anti-fuse programmers to change the input/output data width of the semiconductor memory device.

Thus, the decoder generates a first signal for setting an input/output data width at eight bits, if a signal input through the predetermined address line is toggled once, and generates a second signal for setting the input/output data width at four bits, if the signal input through the predetermined address line is toggled once more.

In accordance with the basic principles of the present invention, there is also provided a semiconductor memory device in which the above circuit is installed, whose I/O data width can be set at any stage of manufacture, including the stages after package-level testing.

BRIEF DESCRIPTION OF THE DRAWINGS

The present invention will now be described in detail with reference to the accompanying drawings, which are included to provide a further understanding of the invention and are incorporated in and constitute a part of this specification in order to illustrate embodiments of the invention, and which, together with the following detailed description, serve to explain the principles of the invention. In the drawings.

DETAILED DESCRIPTION OF THE PREFERRED EMBODIMENT

Figure 1:
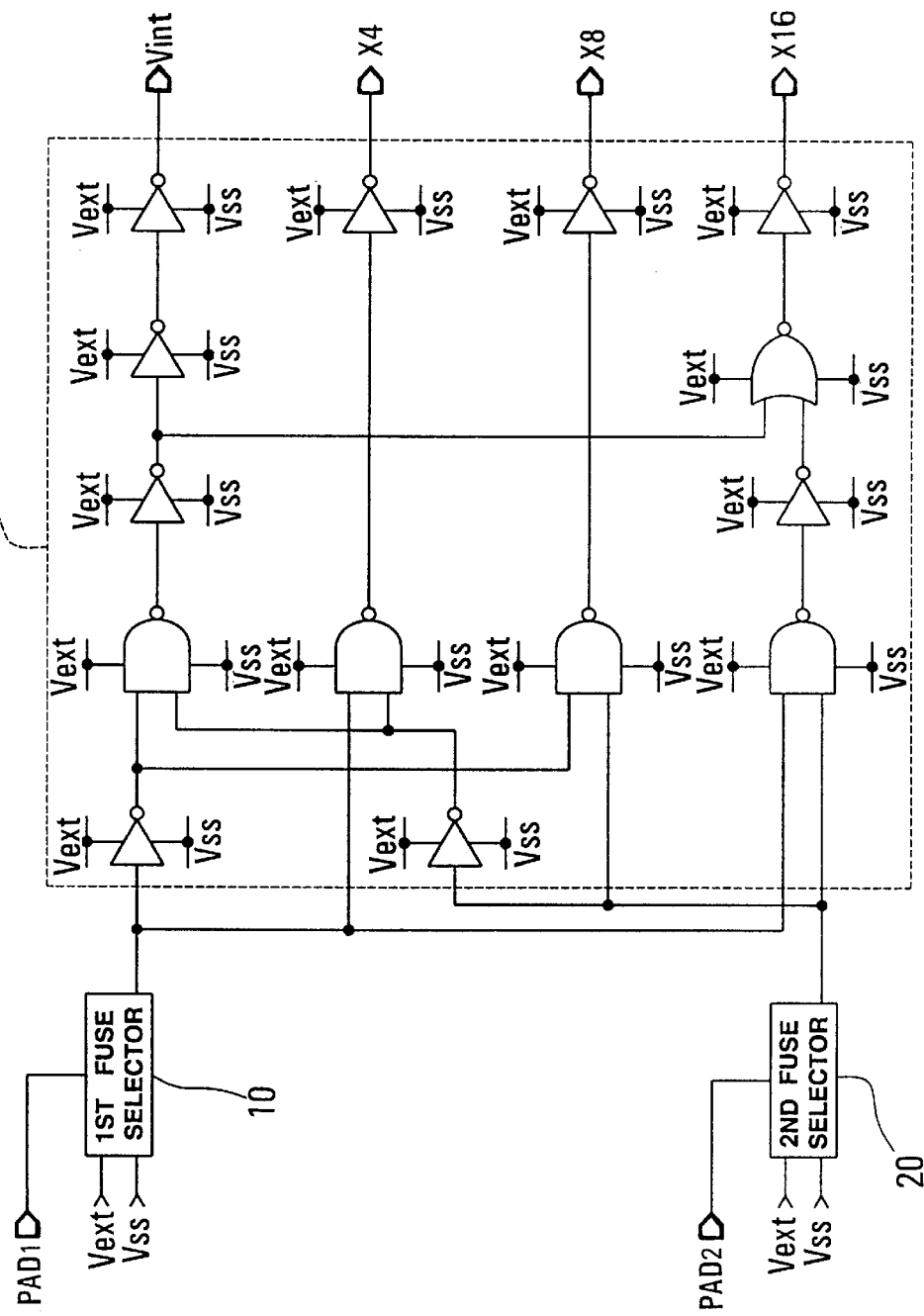
FIG. 1 is a circuit view illustrating a typical I/O data width setting circuit of a conventional memory device.
Figure 2:
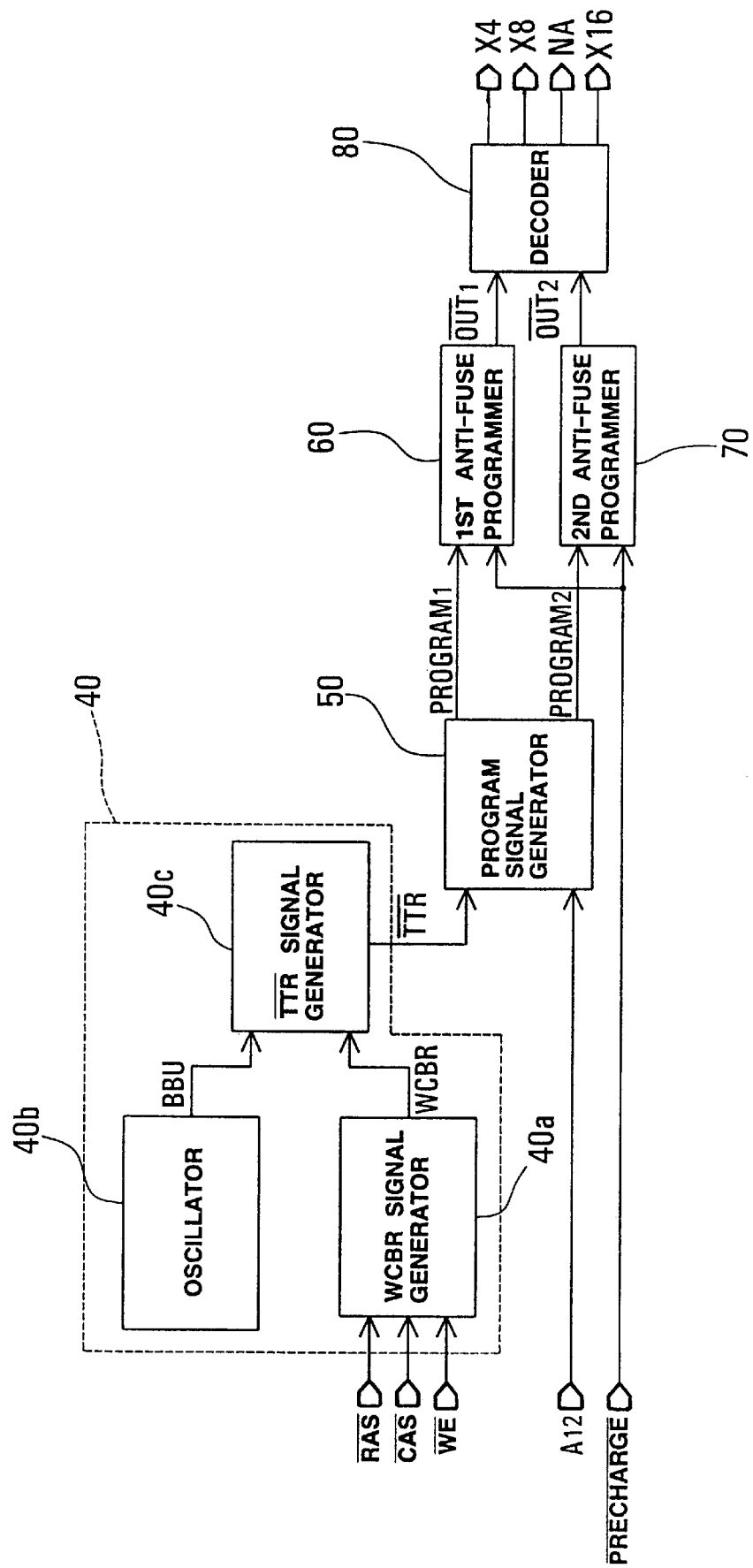
FIG. 2 is a block diagram of a circuit for setting the width of I/O data in a semiconductor memory device, according to the present invention.

Referring to FIG. 2, showing a circuit for setting the width of I/O data in a semiconductor memory device according to the present invention, the circuit is constructed with a test mode signal generator 40, a program signal generator 50, first and second anti-fuse programmers 60 and 70, and a decoder 80.

The test mode signal generating part 40 generates an inverted test time reduction ($\overline{TTR}$) signal which determines a special test mode. The special test mode is set in accordance with a write enable before CAS before RAS (WCBR) cycle. The WCBR signal is activated with the inverted write enable ($\overline{WE}$) signal is low and with the inverted column address strobe ($\overline{CAS}$) signal being enabled before the inverted row address strobe ($\overline{RAS}$) signal. The test mode signal generator 40 includes a WCBR signal generator 40a for generating a WCBR signal determined by the $\overline{RAS}$, $\overline{CAS}$, and $\overline{WE}$ signals, an oscillator 40b for generating a battery back-up (BBU) signal, which is a clock signal having a predetermined period, for instance, 128 $\mu$s, and a $\overline{TTR}$ signal generator 40c for generating a $\overline{TTR}$ signal according to the BBU and WCBR signals.

The program signal generator 50 generates and transmits first (PROGRAM$_1$) and second (PROGRAM$_2$) program signals according to the $\overline{TTR}$ signal and a predetermined address, for instance, a signal $A_{12}$ transmitted through the twelfth address line.

Figure 3:
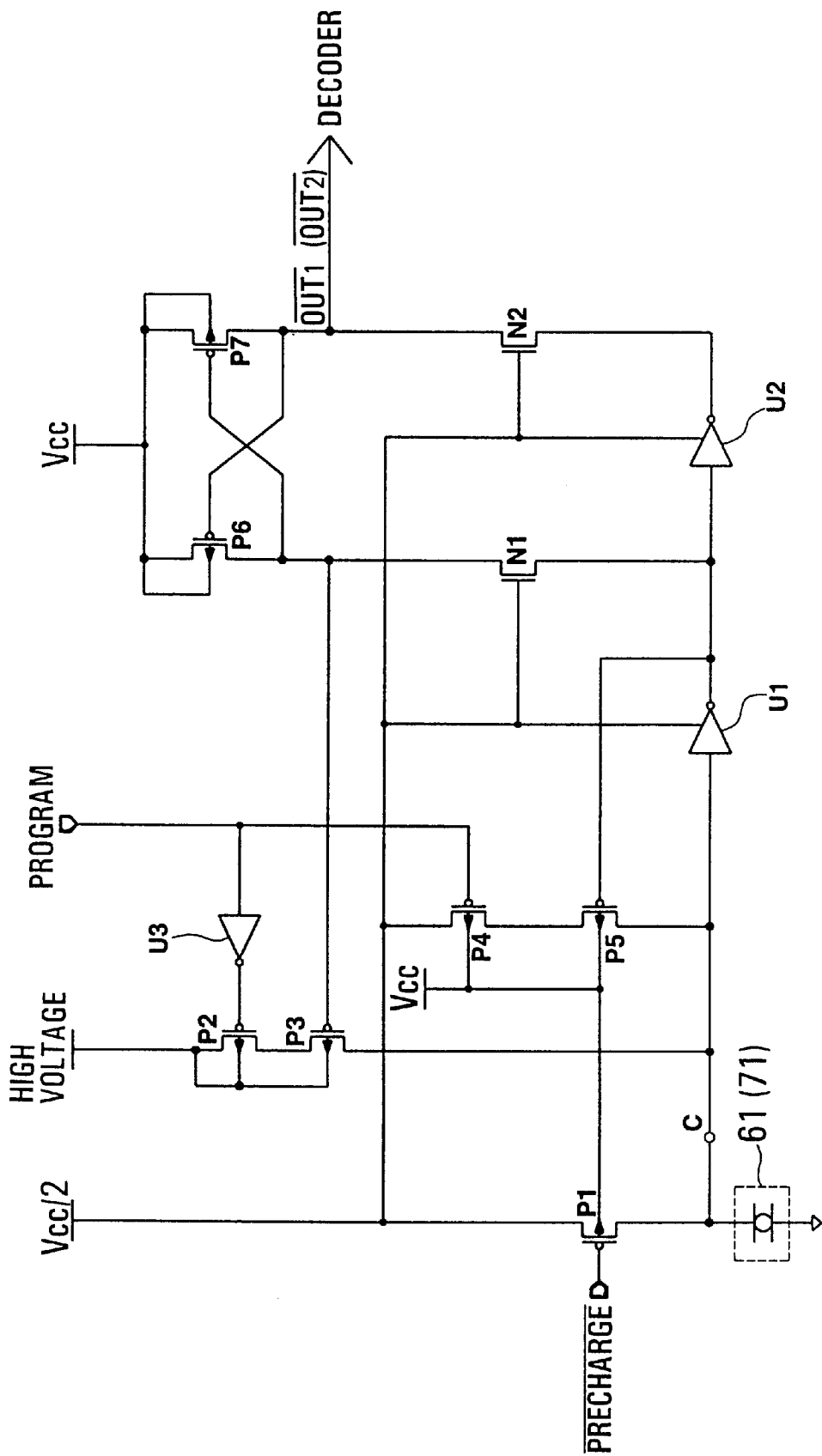
FIG. 3 is a detailed circuit view of an anti-fuse programmer shown in FIG. 2.

As shown in FIG. 3, illustrating a detailed circuit diagram of one or the other of the anti-fuse programmers, the circuit (60 or 70) utilizes an anti-fuse 61 (or 71) programmed in accordance with a program signal. In addition to the anti-fuse, the anti-fuse programmer comprises PMOS transistors P1~P7, NMOS transistors N1 and N2, and inverters U1, U2, and U3. Here, the inverter U3 is not essential to operation since the program signal may be supplied to the first (60) or second (70) anti-fuse programmer in both non-inverted and inverted forms. The transistor P1, connected in series between a half supply voltage (Vcc/2) and the anti-fuse 61 or 71, is controlled by an inverted precharge ($\overline{PRECHARGE}$) signal in order to pre-charge a node "c" in accordance with the programmed status of the anti-fuse. The inverters U1 and U2, each operating with respect to the half supply voltage, are connected in series connected between node "c" and the output of the anti-fuse programmer 60 or 70. The transistors P2 and P3 are connected in series between a high voltage source and node "c" and are turned on in order to supply the anti-fuse with the necessary voltage level for programming in accordance with a program signal. The transistors P4 and P5 are connected in series between node "c" and the half supply voltage. The program signal is used to control the transistors P2 and P4, and the transistor P5 is controlled by the output of the first inverter U1. The transistors P6 and P7 form a cross-coupled feedback loop for supplying the supply voltage to the gate of the transistor P3 and to an output node of the circuit. The transistors N1 and N2, arranged between PMOS transistors P6 and P7 and output terminals of inverters U1 and U2, respectively, are controlled by the half supply voltage. The substrates of the transistors P1, P4, and P5 are biased at the supply voltage potential. The high voltage source is rendered by a bootstrapping method.

The decoder 80, which may be conventionally constructed, decodes first and second programmed output values $\overline{OUT_1}$ and $\overline{OUT_2}$ transmitted from the first and second anti-fuse programmers 60 and 70, respectively, to generate data width setting signals x4, x8, and x16.

As described with respect to the conventional art, when anti-fuses are programmed by external signals transmitted through pads, the size of the memory device is large. Therefore, in the operation of a circuit adopting the principles of the present invention, the anti-fuses are programmed while the circuit is in a special test mode.

To initiate the special test mode, the $\overline{CAS}$ signal goes low before the $\overline{RAS}$ signal, with the $\overline{WE}$ signal is held low, so that the WCBR signal generator 40a generates a WCBR signal. At this time, the oscillator 40b generates the BBU signal having a period of 128 $\mu$s. Accordingly, once a period of 128 $\mu$s has elapsed with the input of the WCBR signal, the $\overline{TTR}$ signal generator 40c generates a $\overline{TTR}$ signal in synchronization with the BBU signal.

Then, the program signal generator 50 generates the first and second program signals according to the $A_{12}$ signal, which is activated in the special test mode. When the $A_{12}$ signal is toggled once, the first program signal transits from its low level to its high level, and if the $A_{12}$ signal is toggled once again, the second program signal transits from its low level to its high level.

More specifically, if a program signal is low, the anti-fuse 61 (or 70) is in its normal (open) state, and when the $A_{12}$ signal is toggled the second time, fuse programming occurs. For instance, as the first program signal goes high to enable the first anti-fuse programmer 60, the anti-fuse 61 is programmed to output a logic low output value $\overline{OUT_1}$. Meanwhile, as the second program signal goes high to enable the second anti-fuse programmer 70, the anti-fuse 71 is programmed to output a logic low output value $\overline{OUT_2}$.

Referring to FIG. 3, beginning with the first (or second) program signal in its low state and the anti-fuse 61 (or 70) open accordingly, a low-level pre-charge signal is transmitted to the gate of the transistor P1. At this time, a low-level program signal is input to the gate of the transistor P4 so that a high-level (inverted) program signal is input to the gate of the transistor P2. Thus, the transistor P1 is turned on to enable node "c" to be pre-charged with the half supply voltage. The first inverter U1 then outputs a low level signal that is fed back to the gate of the transistor P5. As a result, the transistors P5 and P4 are both turned on, so that node "c" is latched at the half supply voltage level. At the same time, the low level signal output from the first inverter U1 is inverted by the second inverter U2, to output a signal at the half supply voltage level. Meanwhile, since the transistors N1 and N2 are turned on by the half supply voltage, the transistors P3 and P7 are turned on and the supply voltage is applied to the drain of the transistor P3 and thus to the output of the circuit. Consequently, with the anti-fuse is in its normal state, i.e., when the program signal is low, the generated output value signal ($\overline{OUT}$) is a high level signal.

On the other hand, if the program signal is high, the anti-fuse is programmed. In other words, if the inverted program signal is low, the transistor P2 is turned on, so that the program signal is high and the transistor P4 is turned off. Thus, a high voltage is applied to the anti-fuse, shorting its dielectric layer. Accordingly, a current path is formed through the anti-fuse to ground, to thereby make the electric potential of node "c" low. This low level signal is sequentially inverted by the first and second inverters U1 and U2. As a result, the programmed output value signal ($\overline{OUT}$) goes low.

As described above, high-level program signals are respectively input to the first and second anti-fuse programmers 60 and 70, to thereby generate low-level output signals $\overline{OUT_1}$ and $\overline{OUT_2}$. Then, the decoder 80 decodes the programmed output values output from the first and second anti-fuse programmers 60 and 70 to generate data width setting signals x4, x8, and x16 according to the level of the first and second program signals. The data width setting signals are summarized in Table 2, illustrating a variety of data width to be set according to a signal input from the circuit of FIG. 2.

TABLE 2

| program$_1$ | program$_2$ | data width |
|---|---|---|
| Vss (L) | Vss (L) | sixteen bits (x16) |
| Vss (L) | Vcc (H) | eight bits (x8) |
| Vcc (H) | Vss (L) | not applicable |
| Vcc (H) | Vcc (H) | four bits (x4) |

In other words, the memory device is initially set to have a data width of sixteen bits. In this case, if the $A_{12}$ signal is toggled once, a high-level second program signal is generated to output a data width setting signal (x8) for setting a data width at eight bits. Thus, the I/O data width of the memory device can be changed to eight bits.

Thereafter, if the $A_{12}$ signal is toggled once more, a high-level first program signal is generated to output a data width setting signal (x4) for setting a data width at four bits. Similarly, the I/O data width of the memory device can be changed to four bits.

As described above, the circuit for setting the width of I/O data in a semiconductor memory device, according to the present invention, enables the changing of the I/O data width at the package level and beyond. Furthermore, by incorporating the programmable anti-fuse and eliminating the use of pads to implement I/O data width changes, layout area is reduced. Accordingly, by adopting the circuit of the present invention, the manufacturer of a semiconductor memory device can response quickly to fluctuations in consumer demand.

Since the present invention may be embodied in various forms, without departing from the essential characteristics thereof, it should be understood that the above-described embodiment is not to be limited by any of the details of the foregoing description, unless otherwise specified, but should be construed only as defined in the appended claims. Thus, all modifications that fall within the scope of the claims are therefore intended to be embraced thereby.

What is claimed is:

1. A circuit for setting the width of input/output data in a semiconductor memory device, said circuit comprising:
   a test mode signal generator for generating a test mode signal which sets a WCBR mode to a special test mode;
   a program signal generator for generating a program signal according to the test mode signal output from said test mode signal generator and a signal transmitted through a predetermined address line;
   a plurality of anti-fuse programmers, each having an anti-fuse for outputting a programmed output value indicative of a program status of an anti-fuse programmed according to the program signal; and
   a decoder for decoding the signal output from said anti-fuse programmers to change the input/output data width of the semiconductor memory device.

2. The circuit as claimed in claim 1, wherein said plurality of anti-fuse programmers comprises:
   a first anti-fuse programmer for generating a first programed output value based on a first program signal; and
   a second anti-fuse programmer for generating a second programed output value based on a second program signal.

3. The circuit as claimed in claim 2, wherein said first and second anti-fuse programmers each comprise:
   an anti-fuse connected between a predetermined node and ground;
   a first PMOS transistor connected between a half supply voltage and said anti-fuse and controlled by an internal signal to pre-charge the predetermined node using the half supply voltage level;
   a second PMOS transistor connected between the predetermined node and a high voltage source and controlled by a fuse-programming signal;
   a third PMOS transistor connected in series with said second PMOS transistor;
   a fourth PMOS transistor connected between the half supply voltage and the predetermined node and controlled by said fuse-programming signal;
   a pair of logic inverters, connected in series, to sequentially invert based on the half supply voltage the level of the pre-charged voltage of the predetermined node;
   a fifth PMOS transistor connected in series with said fourth PMOS transistor, controlled by the inverted voltage level of the predetermined node;

sixth and seventh PMOS transistors, connected to form a cross-coupled feedback loop, for respectively supplying the supply voltage to a gate of said third PMOS transistor and to an output node of one of said anti-fuse programmer and said second anti-fuse programmer; and first and second NMOS transistors, connected between said sixth and seventh PMOS transistors and output terminals of said pair of logic inverters, respectively, each controlled by the half supply voltage.

4. The circuit as claimed in claim 3, wherein said first, fourth, and fifth PMOS transistors are biased using the supply voltage.

5. The circuit as claimed in claim 3, said first and second anti-fuse programmers each further comprising a third logical inverter to invert the fuse-programming signal for input to a gate of the third PMOS transistor.

6. The circuit as claimed in claim 1, wherein said test mode signal generator comprises:

a WCBR signal generator for generating a level of a WCBR signal determined by $\overline{RAS}$, $\overline{CAS}$, and $\overline{WE}$ signals;

an oscillator for generating a clock signal with a predetermined period; and a $\overline{TTR}$ signal generator for generating a $\overline{TTR}$ signal, which indicates a special test mode, according to the clock signal and the level of the WCBR signal respectively output from said oscillator and said WCBR signal generator.

7. The circuit as claimed in claim 6, wherein the predetermined period of the clock signal output from said oscillator is 128 µs.

8. The circuit as claimed in claim 1, wherein said decoder generates a first signal for setting an input/output data width at eight bits, if a signal input through the predetermined address line is toggled once, and generates a second signal for setting the input/output data width at four bits, if the signal input through the predetermined address line is toggled once more.

9. The circuit as claimed in claim 8, wherein, prior to toggling the signal input through the predetermined address line, a third signal for setting the input/output data width at sixteen bits is generated.

10. The circuit as claimed in claim 8, wherein the predetermined address line is the twelfth line.

11. A semiconductor memory device including a circuit for setting the width of input/output data, said memory device comprising:

a test mode signal generator for generating a test mode signal which sets a WCBR mode to a special test mode;

a program signal generator for generating a program signal according to the test mode signal output from said test mode signal generator and a signal transmitted through a predetermined address line;

a plurality of anti-fuse programmers, each having an anti-fuse for outputting a programmed output value indicative of a program status of an anti-fuse programmed according to the program signal; and a decoder for decoding the signal output from said anti-fuse programmers to change the input/output data width of the semiconductor memory device.

12. The memory device as claimed in claim 11, wherein said plurality of anti-fuse programmers comprises:

a first anti-fuse programmer for generating a first programed output value based on a first program signal; and a second anti-fuse programmer for generating a second programed output value based on a second program signal.

13. The memory device as claimed in claim 12, wherein said first and second anti-fuse programmers each comprise:

an anti-fuse connected between a predetermined node and ground;

a first PMOS transistor connected between a half supply voltage and said anti-fuse and controlled by an internal signal to pre-charge the predetermined node using the half supply voltage level;

a second PMOS transistor connected between the predetermined node and a high voltage source and controlled by a fuse-programming signal;

a third PMOS transistor connected in series with said second PMOS transistor;

a fourth PMOS transistor connected between the half supply voltage and the predetermined node and controlled by said fuse-programming signal;

a pair of logic inverters, connected in series, to sequentially invert based on the half supply voltage the level of the pre-charged voltage of the predetermined node;

a fifth PMOS transistor connected in series with said fourth PMOS transistor, controlled by the inverted voltage level of the predetermined node;

sixth and seventh PMOS transistors, connected to form a cross-coupled feedback loop, for respectively supplying the supply voltage to a gate of said third PMOS transistor and to an output node of one of said anti-fuse programmer and said second anti-fuse programmer; and first and second NMOS transistors, connected between said sixth and seventh PMOS transistors and output terminals of said pair of logic inverters, respectively, each controlled by the half supply voltage.

14. The memory device as claimed in claim 13, wherein said first, fourth, and fifth PMOS transistors are biased using the supply voltage.

15. The memory device as claimed in claim 13, said first and second anti-fuse programmers each further comprising a third logical inverter to invert the fuse-programming signal for input to a gate of the third PMOS transistor.

16. The memory device as claimed in claim 11, wherein said test mode signal generator comprises:

a WCBR signal generator for generating a level of a WCBR signal determined by $\overline{RAS}$, $\overline{CAS}$, and $\overline{WE}$ signals;

an oscillator for generating a clock signal with a predetermined period; and a $\overline{TTR}$ signal generator for generating a $\overline{TTR}$ signal, which indicates a special test mode, according to the clock signal and the level of the WCBR signal respectively output from said oscillator and said WCBR signal generator.

17. The memory device as claimed in claim 16, wherein the predetermined period of the clock signal output from said oscillator is 128 µs.

18. The memory device as claimed in claim 11, wherein said decoder generates a first signal for setting an input/output data width at eight bits, if a signal input through the predetermined address line is toggled once, and generates a second signal for setting the input/output data width at four bits, if the signal input through the predetermined address line is toggled once more.

19. The memory device as claimed in claim 18, wherein, prior to toggling the signal input through the predetermined address line, a third signal for setting the input/output data width at sixteen bits is generated.

20. The memory device as claimed in claim 18, wherein the predetermined address line is the twelfth line.

* * * * *